US012648337B2

(12) United States Patent　　　(10) Patent No.:　US 12,648,337 B2
Usui et al.　　　　　　　　　　　　(45) Date of Patent:　　　Jun. 2, 2026

(54) ORGANIC DEVICE, IMAGE FORMING DEVICE, DISPLAY DEVICE, PHOTOELECTRIC CONVERSION DEVICE, ELECTRONIC APPARATUS, ILLUMINATION DEVICE, MOVING BODY, AND WEARABLE DEVICE

(71) Applicant: CANON KABUSHIKI KAISHA, Tokyo (JP)

(72) Inventors: Takashi Usui, Kanagawa (JP); Takayuki Suzuki, Kanagawa (JP); Kotaro Abukawa, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 486 days.

(21) Appl. No.: 17/813,756

(22) Filed: Jul. 20, 2022

(65) Prior Publication Data

US 2023/0032902 A1　　Feb. 2, 2023

(30) Foreign Application Priority Data

Jul. 28, 2021　　(JP) ................................. 2021-123564

(51) Int. Cl.
　　*H10K 59/80*　　　　(2023.01)
　　*H10K 59/122*　　　(2023.01)
　　　　　　　(Continued)
(52) U.S. Cl.
　　CPC ......... *H10K 59/873* (2023.02); *H10K 59/122* (2023.02); *H10K 59/131* (2023.02); (Continued)

(58) Field of Classification Search
　　CPC ...... H10K 50/82; H10K 50/81; H10K 50/844; H10K 59/122; H10K 71/00; H10K 39/32; (Continued)

(56) References Cited

U.S. PATENT DOCUMENTS 10,838,565 B2　　11/2020　Miyamoto et al.
11,018,316 B2　　5/2021　Matsuda et al.
(Continued)

FOREIGN PATENT DOCUMENTS

JP　　　　2017-73206 A　　4/2017
JP　　　　2018-113104 A　　7/2018
(Continued)

OTHER PUBLICATIONS

Notice of Reasons for Refusal in Japanese Application No. 2021-123564 (Jan. 2025).

*Primary Examiner* — Jacob Y Choi
*Assistant Examiner* — Grace Cha
(74) *Attorney, Agent, or Firm* — VENABLE LLP

(57) ABSTRACT

An organic device comprising a pixel region in which pixels are arranged, a peripheral region including a pad electrode, and a sealing layer arranged to cover the pixel and peripheral regions, is provided. In the peripheral region, an opening of the sealing layer is formed. The opening comprises a first portion extending from a plane defined by an upper surface of the sealing layer towards the pad electrode, and a second portion which has an outer edge inside outer edges of the first portion and the pad electrode and opens from a lower end of the first portion to the pad electrode. A conductive particle for electrical connection to an electrode is arranged on the pad electrode, and a diameter of the conductive particle is larger than a height of the second portion.

24 Claims, 9 Drawing Sheets

(51) Int. Cl.
  *H10K 59/131* (2023.01)
  *H10K 71/00* (2023.01)
  *H10K 39/32* (2023.01)

(52) U.S. Cl.
  CPC ..... *H10K 59/8051* (2023.02); *H10K 59/8052* (2023.02); *H10K 71/00* (2023.02); *H10K 39/32* (2023.02)

(58) Field of Classification Search
  CPC ......... H10K 59/8052; H10K 2102/331; H10K 59/131; H10K 59/8051; H10K 71/10; H10K 59/873; Y02E 10/549
  See application file for complete search history.

(56) References Cited

U.S. PATENT DOCUMENTS

| | | | | |
|---|---|---|---|---|
| 2018/0342707 | A1* | 11/2018 | Lee | H10K 59/124 |
| 2019/0310724 | A1* | 10/2019 | Yeke Yazdandoost | G02F 1/13338 |
| 2019/0326549 | A1 | 10/2019 | Kokame et al. | |
| 2019/0334115 | A1* | 10/2019 | Matsuda | H10K 59/873 |
| 2020/0091258 | A1* | 3/2020 | Okabe | H10K 50/818 |
| 2020/0243611 | A1* | 7/2020 | Kato | H10K 59/8731 |
| 2022/0255042 | A1 | 8/2022 | Naruse et al. | |

FOREIGN PATENT DOCUMENTS

| | | | |
|---|---|---|---|
| JP | 2018-163309 A | 10/2018 |
| JP | 2019-194970 A | 11/2019 |
| JP | 2021-72282 A | 5/2021 |
| KR | 10-2019-0119113 A | 10/2019 |

* cited by examiner

F I G.  6
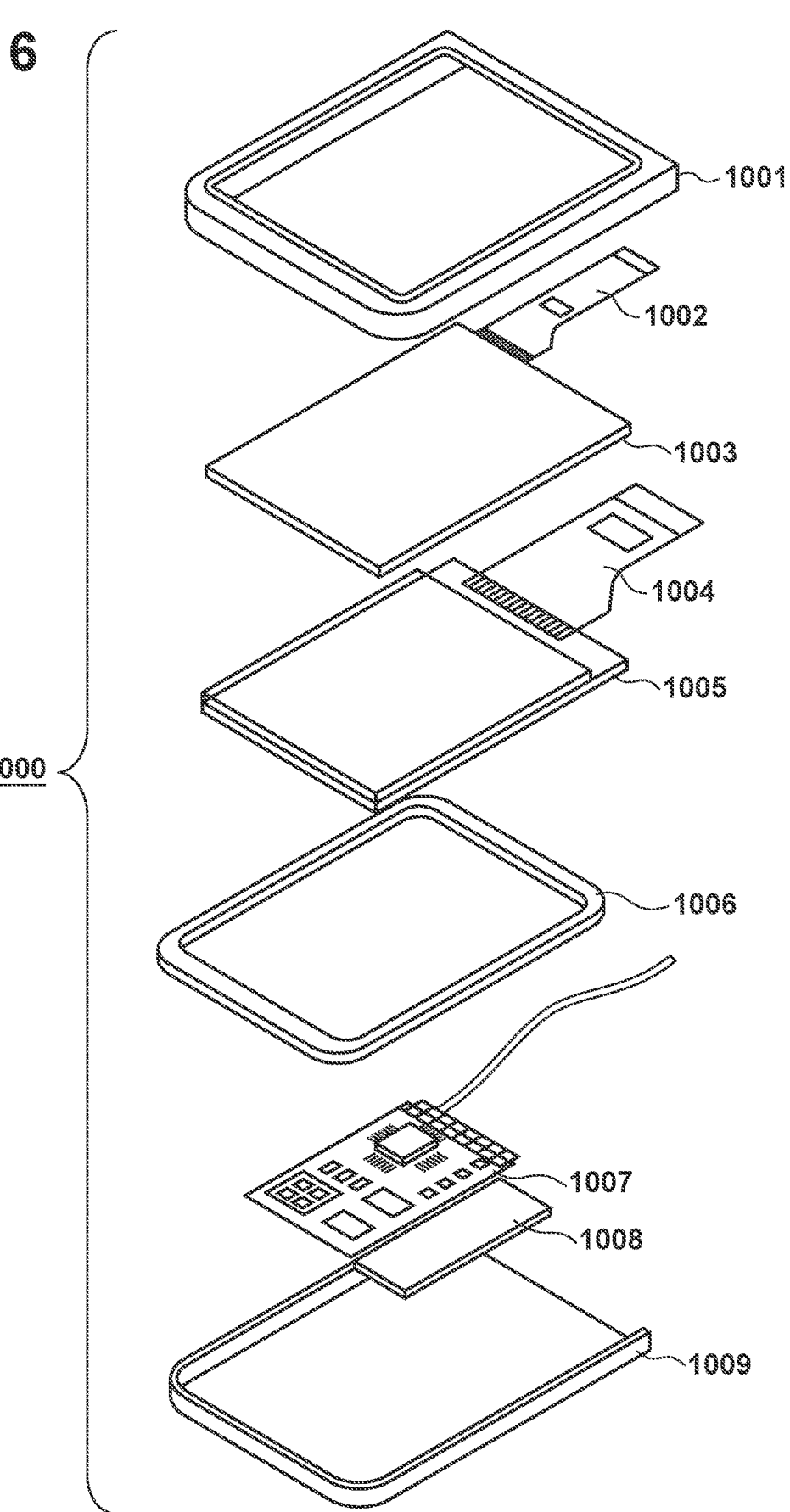
1000
1001
1002
1003
1004
1005
1006
1007
1008
1009

F I G. 7
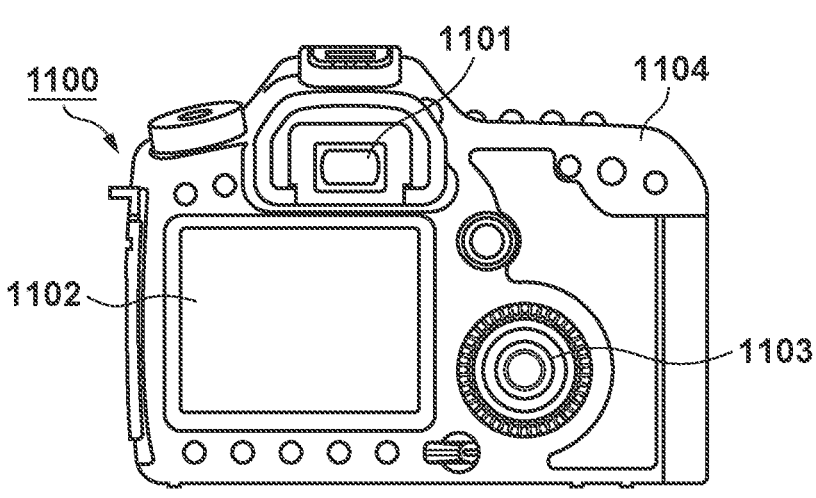
F I G. 8
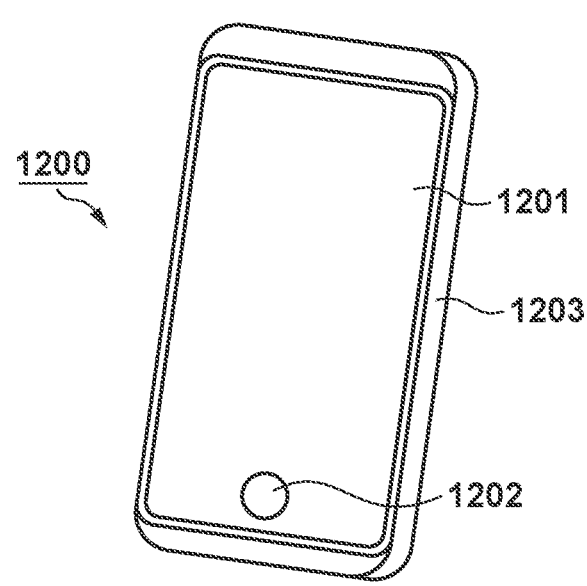

F I G. 12A
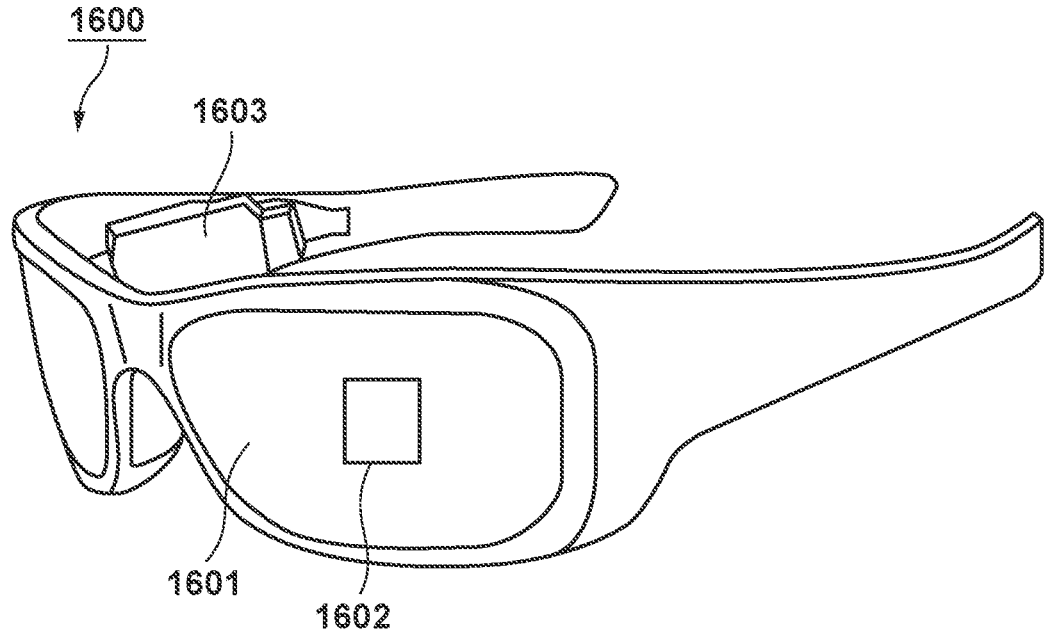
F I G. 12B
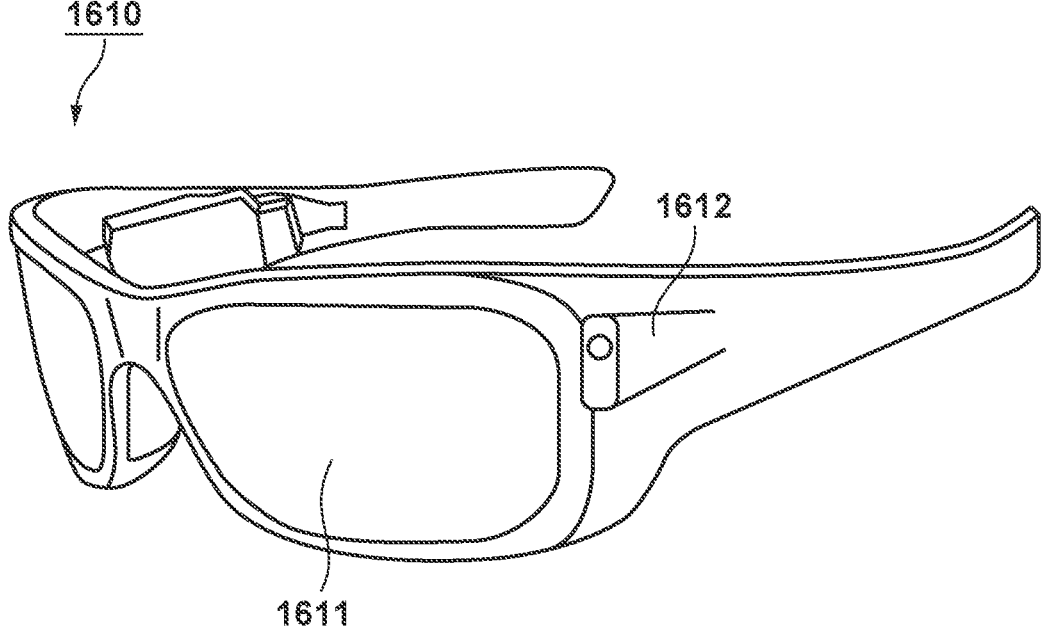

ORGANIC DEVICE, IMAGE FORMING DEVICE, DISPLAY DEVICE, PHOTOELECTRIC CONVERSION DEVICE, ELECTRONIC APPARATUS, ILLUMINATION DEVICE, MOVING BODY, AND WEARABLE DEVICE

BACKGROUND OF THE INVENTION

Field of the Invention

The present invention relates to an organic device, an image forming device, a display device, a photoelectric conversion device, an electronic apparatus, an illumination device, a moving body, and a wearable device.

Description of the Related Art

An organic device including an organic function layer containing an organic compound is known. Examples are a light emitting device using an organic electroluminescence film, and an image capturing device using an organic photoelectric conversion film. The organic compound easily deteriorates the characteristics due to water. Japanese Patent Laid-Open No. 2019-194970 has disclosed a technique that seals an organic function layer by using a sealing layer having a stacked structure.

If the thickness of the sealing layer is increased to improve reliability, the step of an opening for exposing a pad electrode in a peripheral region increases, and a bonding failure may occur in a bonding step of connecting a wiring to the pad electrode.

SUMMARY OF THE INVENTION

Some embodiments of the present invention provide a technique advantageous in improving the reliability of an organic device.

According to some embodiments, an organic device comprising, on a main surface of a substrate, a pixel region in which a plurality of pixels including an organic function layer are arranged, and a peripheral region including a pad electrode, and comprising a sealing layer arranged to cover the pixel region and the peripheral region, wherein in the peripheral region, an opening of the sealing layer is formed, the opening of the sealing layer comprises a first portion extending from a plane defined by an upper surface of the sealing layer towards the pad electrode, and a second portion which has an outer edge inside an outer edge of the first portion and an outer edge of the pad electrode in orthogonal projection to the main surface and opens from a lower end of the first portion to the pad electrode, a conductive particle for electrical connection to an electrode arranged outside the organic device is arranged on the pad electrode, and a diameter of the conductive particle is larger than a height of the second portion, is provided.

According to some other embodiments, a method of manufacturing an organic device including, on a main surface of a substrate, a pixel region in which a plurality of pixels including an organic function layer are arranged, and a peripheral region including a pad electrode, comprising: forming the plurality of pixels and the pad electrode; forming a sealing layer to cover the plurality of pixels and the pad electrode; forming an opening for exposing the pad electrode in the sealing layer; and arranging, on the pad electrode, a conductive particle for connection to an electrode arranged outside the organic device, wherein the forming the opening comprises etching a first portion extending from an upper surface of the sealing layer towards the pad electrode, and etching a second portion having an outer edge inside an outer edge of the first portion and an outer edge of the pad electrode in orthogonal projection to the main surface and opening from a lower end of the first portion to the pad electrode, and a diameter of the conductive particle is larger than a height of the second portion, is provided.

Further features of the present invention will become apparent from the following description of exemplary embodiments (with reference to the attached drawings).

BRIEF DESCRIPTION OF THE DRAWINGS

FIG. 6 is a view showing an example of a display device using the organic device of the embodiment;

FIG. 7 is a view showing an example of a photoelectric conversion device using the organic device of the embodiment;

FIG. 8 is a view showing an example of an electronic apparatus using the organic device of the embodiment;

FIGS. 12A and 12B are views each showing an example of a wearable device using the organic device of the embodiment.

DESCRIPTION OF THE EMBODIMENTS

Figure 1:
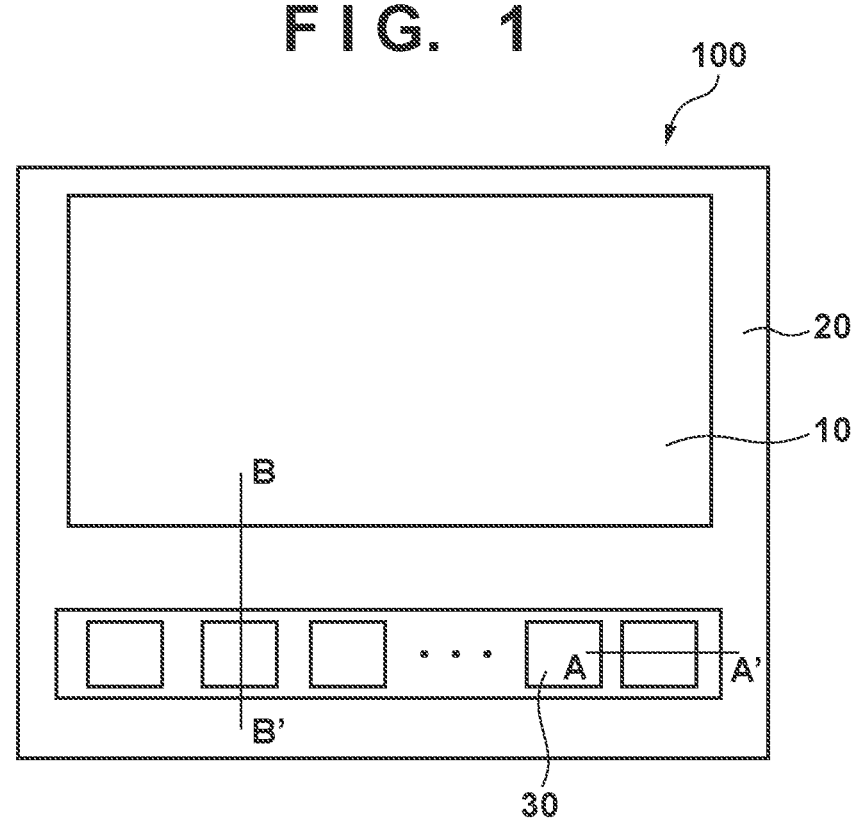
FIG. 1 is a plan view of an organic device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
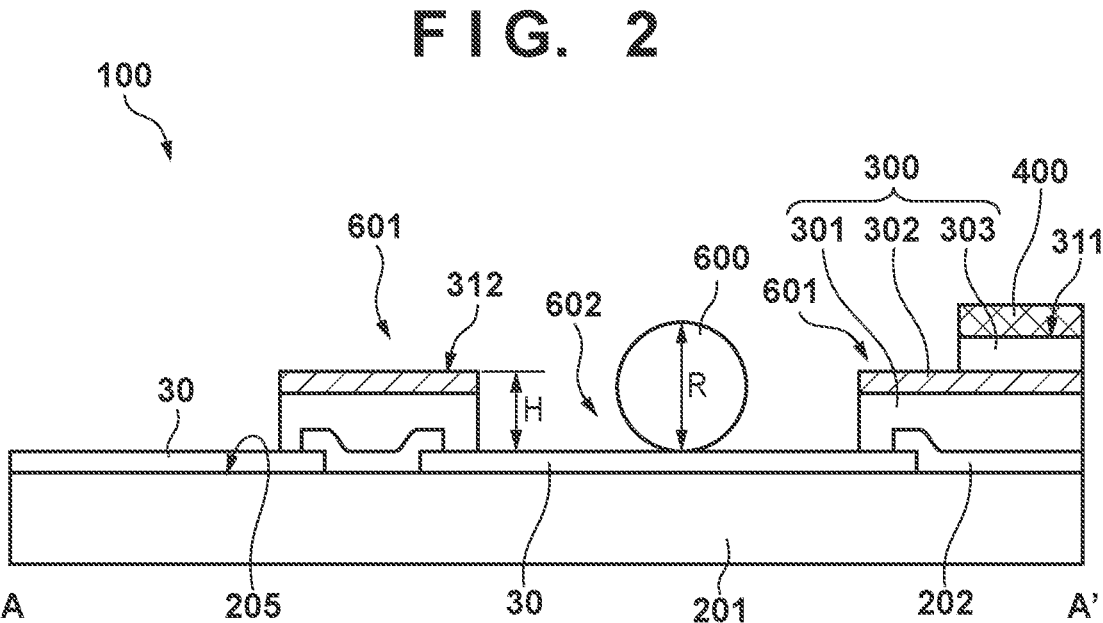
FIG. 2 is a sectional view of the organic device shown in FIG. 1.
Figure 3:
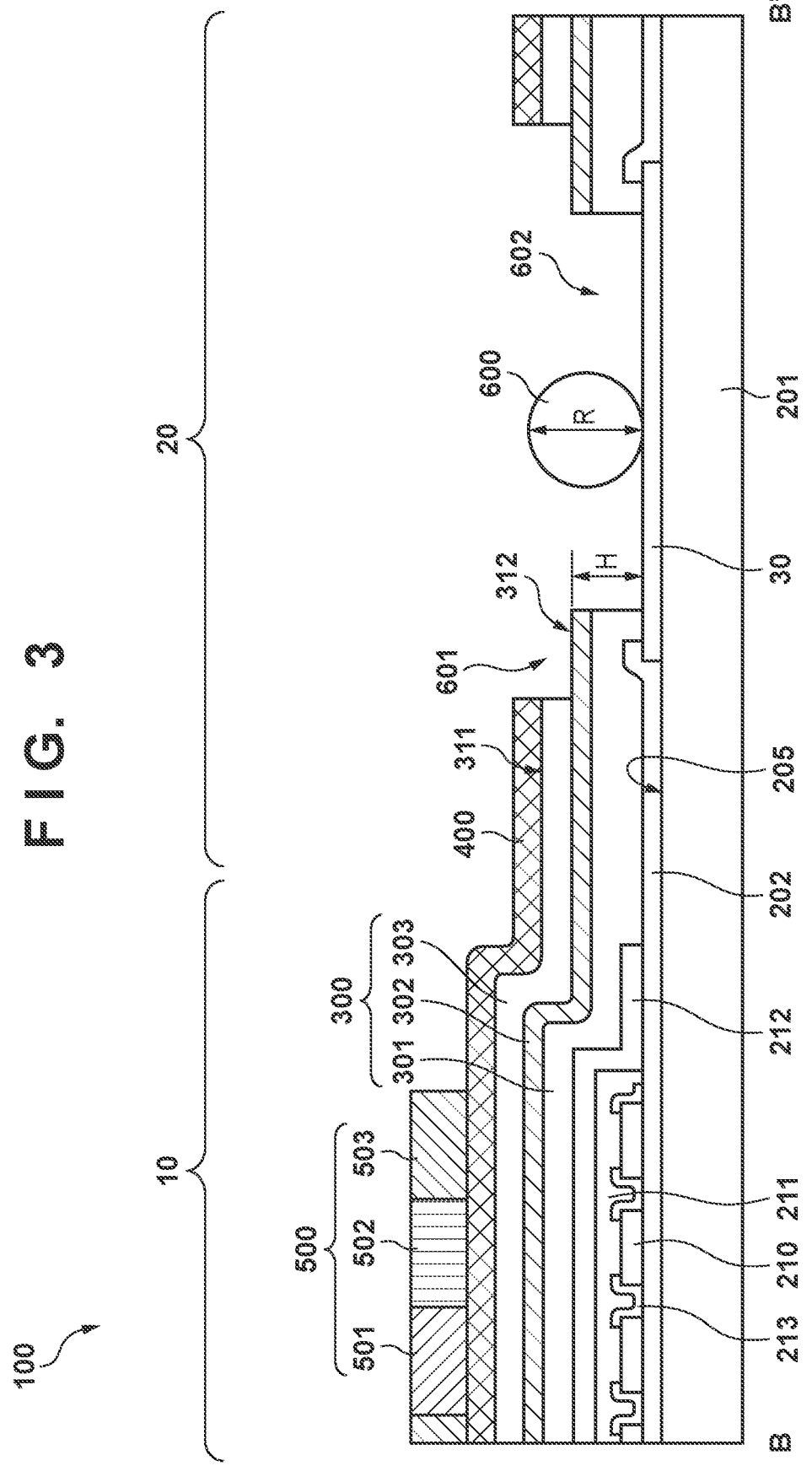
FIG. 3 is a sectional view of the organic device shown in FIG. 1.

An organic device according to an embodiment of the present invention will be described with reference to FIGS. 1 to 3. FIG. 1 is a plan view showing the structure of an organic device 100 according to the present invention. FIG. 2 is a sectional view of the organic device 100 taken along a line A-A' in FIG. 1. FIG. 3 is a sectional view of the organic device 100 taken along a line B-B' in FIG. 1.

As shown in FIG. 1, the organic device 100 includes a pixel region 10 in which a plurality of pixels are arranged, and a peripheral region 20 including pad electrodes 30. Each pixel arranged in the pixel region 10 includes an organic function layer 211 using an organic light emitting material or an organic photoelectric conversion material, so the organic device 100 can function as a light emitting device including light emitting elements or an image capturing device including photoelectric conversion elements. The peripheral region 20 can be arranged to surround the pixel region, as shown in FIG. 1, or can be arranged along one or more sides of the pixel region 10. Circuits for controlling the pixel region 10 and the like can be arranged in the peripheral region 20. The pad electrodes 30 arranged in the peripheral region 20 can be used to exchange signals and the like between the organic device 100 and the outside of the organic device 100. For example, the pad electrodes 30 can be used to output signals generated in the organic device 100 to the outside, and can also be used to input signals for controlling the organic device 100 from outside the organic device 100. For example, the pad electrodes 30 can further be used to supply electric power for driving the organic device 100. The pad electrode 30 can be formed by using a metal material such as aluminum, silver, an aluminum alloy, a silver alloy, titanium, or titanium nitride.

As shown in FIGS. 2 and 3, the organic device 100 is obtained by stacking an insulating layer 202, a sealing layer 300, and a resin layer 400 in this order from a main surface 205 of a substrate 201. In the pixel region 10, lower electrodes 210, the organic function layer 211, and an upper electrode 212 are arranged between the insulating layer 202 and the sealing layer 300. In other words, the insulating layer 202 is arranged between the organic function layer 211 and the main surface 205 of the substrate 201. In the peripheral region 20, the insulating layer 202, the sealing layer 300, and the resin layer 400 include openings for exposing the pad electrodes 30. In this specification, the surface of the substrate 201 on which the insulating layer 202, the sealing layer 300, the resin layer 400, and the like are arranged will be called the main surface 205.

The insulating layer 202 is formed by using an insulating material. The insulating layer 202 can contain a compound containing at least oxygen and silicon, for example, an inorganic material such as a silicon-oxide-based material. The insulating layer 202 may also be formed by using an organic material such as a thermosetting resin or a thermoplastic resin. In this embodiment, the insulating layer 202 is formed by using silicon oxide ($SiO_x$). For example, the insulating layer 202 can be formed by a chemical vapor deposition method (CVD method) using tetraethoxysilane (TEOS). The insulating layer 202 is required to have a high coverage, and TEOS makes it possible to obtain silicon oxide having a high coverage by a surface reaction via an ethoxy group. Furthermore, when compared to a case in which the insulating layer 202 is formed by using monosilane ($SiH_4$) gas having pyrophoricity, TEOS having no pyrophoricity can be handled safely. To ensure insulation and planarity, the thickness of the insulating layer 202 can be 0.5 μm (inclusive) to 5.0 μm (inclusive).

As the substrate 201, it is possible to use an insulating substrate such as glass or a resin, a conductive substrate such as aluminum or stainless steel, or a semiconductor substrate such as silicon. Electronic circuits (not shown) such as transistors and wiring patterns are formed between the substrate 201 and the insulating layer 202.

The lower electrodes 210 are arranged on the insulating layer 202 in the pixel region 10. The lower electrodes 210 are connected to the electronic circuits arranged between the substrate 201 and the insulating layer 202 by plug electrodes (not shown) formed by a conductive material such as tungsten. The lower electrodes 210 may also be made of a highly conductive metal material. The lower electrodes 210 can be formed by using a metal material such as aluminum, silver, an aluminum alloy, a silver alloy, titanium, or titanium nitride. To reduce a current leak between the lower electrodes 210, an insulating layer 213 can be arranged to surround the outer edges of the lower electrodes 210.

The upper electrode 212 is formed on the organic function layer 211. When the organic function layer 211 contains an organic light emitting material, the upper electrode 212 is an electrode for emitting light generated by the organic function layer 211. When the organic function layer 211 contains an organic photoelectric conversion material, the upper electrode 212 is an electrode for transmitting light to enter the organic function layer 211. To use a large amount of light, the upper electrode 212 can be formed by using a material having a high light transmittance. It is possible to use a transparent oxide conducive material such as tin oxide, indium oxide, indium tin oxide, or indium zinc oxide for the upper electrode 212. A thin-film metal electrode may also be used as the upper electrode 212. In this case, it is possible to use a thin film of, for example, gold, platinum, silver, aluminum, chromium, magnesium, or an alloy of these metals. When using the thin-film metal electrode, the film thickness can be 1 nm (inclusive) to 30 nm (inclusive) in order to achieve both a high conductivity and suppression of light absorption by the metal. When using magnesium for the upper electrode 212, water penetration needs to be suppressed as in the organic function layer 211, because magnesium easily reacts with water.

The sealing layer 300 is arranged on the upper electrode 212. In this embodiment, from the upper surface side of the substrate 201, the sealing layer 300 includes water preventing layers 301 and 303 having water permeability lower than that of the insulating layer 202. The sealing layer 300 further includes a defect preventing layer 302 arranged between the water preventing layers 301 and 303, and having defect density lower than that of the water preventing layer 301. In this embodiment, the sealing layer 300 has a stacked structure including the water preventing layers 301 and 303 having a low water permeability and the defect preventing layer 302 having an extremely high coverage and a low defect density, and can thus suppress the influence of water in the external atmosphere on the organic function layer 211.

The water preventing layers 301 and 303 can contain a compound containing at least nitrogen and silicon, more specifically, can contain a silicon-nitride-based material. For example, the water preventing layers 301 and 303 may be a so-called nitride film made of silicon nitride (SiN) or silicon oxynitride (SiON) formed by using the CVD method. The water preventing layers 301 and 303 using silicon nitride or silicon oxynitride formed by the CVD method have an extremely low water permeability of about $1\times10^{-6}$ g/cm² day. The material of the water preventing layers 301 and 303 is not limited to silicon nitride or silicon oxynitride, and can be any material as long as these layers are formed to have a high light transmittance as in the upper electrode 212 and water permeability lower than that of the insulating layer 202. For example, the water preventing layers 301 and 303 can be formed to have a water permeability of $1\times10^{-5}$ g/m² day or less. The water preventing layers 301 and 303 can be layers made of the same material such as silicon nitride, or can be layers made of different materials such as silicon nitride and silicon oxynitride. Furthermore, the film thicknesses of the water preventing layers 301 and 303 can be either the same or different.

The defect preventing layer 302 can contain a compound containing at least oxygen and aluminum, more specifically, can contain an aluminum-oxide-based material. For example, the defect preventing layer 302 can be aluminum oxide formed by using an atomic layer deposition method (ALD method). The substrate 201 on which the water preventing layer 301 is formed is placed in a deposition chamber in a vacuum state, and trimethyl aluminum (TMA) gas is supplied, thereby adsorbing a monoatomic layer of TMA to the surface of the water preventing layer 301. After that, the TMA gas is exhausted from the deposition chamber. Then, oxygen is supplied, and plasma is generated by inputting high-frequency electric power, thereby oxidizing TMA adsorbed on the surface of the water preventing layer 301. Subsequently, $O_2$ in the deposition chamber is exhausted. Consequently, a monoatomic layer of aluminum oxide is formed on the surface of the water preventing layer 301. The defect preventing layer 302 using aluminum oxide having a desired film thickness can be formed by repeating this process.

The defect preventing layer 302 formed by the ADL method has high film deposition properties in an uneven portion and also has an extremely high coverage, and thus has the feature that the defect density in the film is lower than that of a thin film deposited by a sputtering method or the CVD method. The ALD method has a long deposition time. Therefore, to shorten the tact time for depositing the defect preventing layer 302, the film thickness of the defect preventing layer 302 can be several tens to hundreds of nm. For example, the film thickness of the defect preventing layer 302 can be 10 nm (inclusive) to 500 nm (inclusive), and can also be 50 nm (inclusive) to 100 nm (inclusive). In this embodiment, aluminum oxide formed by using the ALD method is used as the defect preventing layer 302. However, it is also possible to use titanium oxide, zirconium oxide, or the like. Furthermore, the formation method is not limited to the ALD method, and it is only necessary to be able to form the defect preventing layer 302 having high film deposition properties in an uneven portion and a high coverage.

As the resin layer 400, a thermosetting resin, a thermoplastic resin, or the like can be used. As the resin layer 400, it is possible to use, for example, a phenol resin, an epoxy resin, a polyimide resin, a polyethylene resin, a polystyrene resin, an acrylic resin, a fluorine resin, or a material mixture of these resins. In addition, a surface treatment for improving the water repellency of the surface of the resin layer 400 may also be performed. For example, it is possible to roughen the surface of the resin layer 400 by etching the surface, or form a fluorine coat on the surface of the resin layer 400 by performing plasma processing using a fluorine-based gas on the surface of the resin layer 400.

The organic device 100 may also include a color filter 500 above the sealing layer 300. The color filter 500 can include a red transmission filter 501, a green transmission filter 502, and a blue transmission filter 503 that are arranged on the resin layer 400 to also be used as an underlying planarizing layer of the color filter 500. A planarizing layer (not shown) using a resin may further be arranged on the color filter 500. The step of forming the color filter 500 is performed by repeating material coating, exposure, and development for each color filter. In the arrangement shown in FIG. 3, the resin layer 400 also functions as the planarizing layer of the color filter 500. However, it is also possible to form a planarizing layer (not shown) on the resin layer 400, and form the color filter 500 on the planarizing layer. On the other hand, by causing the resin layer 400 to function as a planarizing layer, it is possible to simplify the process and reduce the cost when manufacturing the organic device 100.

Next, the structure around the pad electrode 30 arranged in the peripheral region 20 in this embodiment will be described in detail. In the peripheral region 20, the insulating layer 202, the sealing layer 300, and the resin layer 400 include openings for exposing the pad electrodes 30. The opening formed in the sealing layer 300 includes a portion 601 extending from a plane defined by an upper surface 311 of the sealing layer 300 towards the pad electrode 30, and a portion 602 which has an outer edge inside the outer edge of the portion 601 and the outer edge of the pad electrode 30 in orthogonal projection to the main surface 205 of the substrate 201 and opens from a lower end 312 of the portion 601 to the pad electrode 30. This exposes the pad electrode 30. As shown in FIGS. 2 and 3, the outer edge of the portion 601 of the pad electrode 30 may be arranged outside the outer edge of the pad electrode 30 in orthogonal projection to the main surface 205 of the substrate 201. As described above, the opening of the sealing layer 300 for exposing the pad electrode 30 has a step including the lower end 312 in the sealing layer 300.

On the exposed pad electrode 30, a conductive particle 600 for electrical connection to an electrode arranged outside the organic device 100 is arranged. Although FIGS. 2 and 3 each show one conductive particle 600, a number of conductive particles are actually arranged. For example, the conductive particle 600 is a particle contained in an anisotropic conductive film (ACF), and can be connected to a flexible cable for electrically connecting the organic device 100 to the outside by using the ACF or the like. In this embodiment, a diameter R of the conductive particle 600 is larger than a height H of the portion 602. In this case, the diameter R of the conductive particle 600 can be the average diameter of a plurality of conductive particles arranged on the pad electrode 30 and contained in the ACF or the like.

If the sealing layer 300 is thickened to protect the organic function layer 211 from water or the like, the step of the opening for exposing the pad electrode 30 becomes larger in the peripheral region 20. If the step becomes larger, a bonding failure may occur in a bonding step of connecting a wiring to the pad electrode 30. As shown in FIGS. 2 and 3, since the step of the openings for exposing the pad electrode 30, which are generated by the sealing layer 300 and the resin layer 400, is larger than the diameter R of the conductive particle 600, if the overall openings formed in the sealing layer 300 and the resin layer 400 are arranged inside the outer edge of the pad electrode 30, a bonding failure may occur. To cope with this, to decrease the step generated in the openings, the opening formed in the sealing layer 300 is divided into the wide portion 601 and the portion 602, and the step (height H) generated by the portion 602 is decreased. This can suppress occurrence of a bonding failure in a bonding step of connecting a wiring to the pad electrode 30.

In this embodiment, the portion 601 opens in the water preventing layers 301 and 303 and the defect preventing layer 302 of the sealing layer 300, and the portion 602 opens in the water preventing layer 301 and the defect preventing layer 302 of the sealing layer 300. The present invention, however, is not limited to this, and the portion 601 may open in the water preventing layers 301 and 303 and the defect preventing layer 302 of the sealing layer 300 and the portion 602 may open in the water preventing layer 301 of the sealing layer 300. As shown in FIGS. 2 and 3, in orthogonal projection to the main surface 205 of the substrate 201, the outer edge of the opening of the resin layer 400 is arranged outside the outer edge of the portion 602. In this case, in orthogonal projection to the main surface 205 of the substrate 201, the outer edge of the opening of the resin layer 400 may be arranged to overlap the outer edge of the portion 601 of the opening of the sealing layer 300. When the outer edge of the opening of the resin layer 400 is aligned with the portion 601 of the opening of the sealing layer 300, it may be possible to suppress a process step when forming the openings. In addition, the outer edge of the opening of the resin layer 400 may be arranged outside the outer edge of the portion 601 of the opening of the sealing layer 300.

In the arrangement shown in FIGS. 2 and 3, the sealing layer 300 has the three-layer structure of the water preventing layers 301 and 303 and the defect preventing layer 302. The present invention, however, is not limited to this. For example, the sealing layer 300 may have a single-layer structure using one material. For example, the sealing layer 300 may have a two-layer structure using different materials. In this case, the portion 601 of the opening may open in the upper layer and the portion 602 of the opening may open in the lower layer. When the materials of the upper layer and the lower layer are different from each other, the process may become easy by using the lower layer as an etching stopper when etching the portion 601.

In this embodiment, in orthogonal projection to the main surface 205 of the substrate 201, the outer edge of the opening of the insulating layer 202 is arranged outside the outer edge of the portion 602 of the opening of the sealing layer 300. In other words, the water preventing layer 301 is formed to cover the outer edge of the opening of the insulating layer 202. The insulating layer 202 formed by using silicon oxide and having relatively high water permeability is not exposed around the pad electrode 30, and is covered with the water preventing layer 301 using a silicon-nitride-based material having low water permeability. For example, the water permeability of silicon oxide used for the insulating layer 202 is higher than that of the silicon-nitride-based material used for the water preventing layer 301 by about 1 to 3 orders of magnitude. This can suppress water from permeating in the organic function layer 211 via the insulating layer 202.

In the arrangement shown in FIGS. 2 and 3, the opening of the sealing layer 300 for exposing the pad electrode 30 has the two-stage structure including the one lower end 312 in the sealing layer 300. The present invention, however, is not limited to this. The opening of the sealing layer 300 for exposing the pad electrode 30 may have a three- or more-stage structure. For example, a step may further be formed in the portion 601 and a step may further be formed in the portion 602. These steps can be arranged so that the opening becomes wider stepwise from the pad electrode 30 to the upper surface 311 of the sealing layer 300. In this case, if the outer edge of the opening of the insulating layer 202 is arranged outside the outer edge of the portion 602 of the opening of the sealing layer 300 in orthogonal projection to the main surface 205 of the substrate 201 regardless of the number of steps, it is possible to suppress water from permeating in the organic function layer 211.

As shown in FIG. 2, in the adjacent pad electrodes 30, the portion 601 formed in correspondence with one of the pad electrodes 30 and the portion 601 formed in correspondence with the other pad electrode 30 may be formed continuously. That is, the adjacent pad electrodes 30 may be separated by the water preventing layer 301 and the defect preventing layer 302 of the sealing layer 300 and the insulating layer 202. Thus, the step generated in the direction in which the pad electrodes 30 are continuously arranged always has the height H, thereby suppressing occurrence of a bonding failure.

The organic function layer 211 will now be described in detail. As described above, the organic function layer 211 according to this embodiment contains at least an organic light emitting material or an organic photoelectric conversion material. When the organic function layer 211 contains the organic light emitting material, the organic device 100 can function as a light emitting device. On the other hand, when the organic function layer 211 contains the organic photoelectric conversion material, the organic device 100 can function as an image capturing device.

A well-known organic light emitting material can be used as the organic light emitting material. It is possible to use a light emitting material that singly functions as a light emitting layer, or use a mixed layer of a light emitting layer host material and a light emitting material. Examples of the organic light emitting material are condensed-ring compounds (for example, a fluorene derivative, a naphthalene derivative, a pyrene derivative, a perylene derivative, a tetracene derivative, an anthracene derivative, and rubrene), a quinacridone derivative, a coumarin derivative, a stilbene derivative, an organic aluminum complex such as tris(8-quinolinolato)aluminum, an iridium complex, a platinum complex, a rhenium complex, a copper complex, a europium complex, a ruthenium complex, and polymer derivatives such as a poly(phenylenevinylene) derivative, a poly(fluorene) derivative, and a poly(phenylene) derivative.

Examples of the light emitting layer host material are an aromatic hydrocarbon compound or its derivative, a carbazole derivative, a dibenzofuran derivative, a dibenzothiophene derivative, an organic aluminum complex such as tris(8-quinolinolato)aluminum, and an organic beryllium complex.

As the organic photoelectric conversion material, it is possible to use a well-known organic material or organic-inorganic hybrid material. Examples of the organic photoelectric conversion material are a fullerene-based material, a phthalocyanine-based material, a metal-complex-based material, a squarylium-based material, an amine-based material, an indan-based material, and a fluorene-based material. The organic function layer 211 can be made of one or a plurality of these organic photoelectric conversion materials. The organic function layer 211 can also have a structure obtained by stacking layers using these materials. As the organic-inorganic hybrid material, a material for forming an organic-inorganic hybrid perovskite film can be used. This material forming the organic-inorganic hybrid perovskite film can be represented by a general formula $ABX_3$. In this general formula, A and B are cation materials, and X is an anion material. In the organic-inorganic hybrid material, one of A, B, and X is an organic material. An example is $CH_3NH_3PbI_3$ in which A=$CH_3NH_3$, B=Pb, and X=I.

An additional function layer can be arranged between the organic function layer 211 and the lower electrodes 210, or between the organic function layer 211 and the upper electrode 212. Examples of the additional function layer are a charge transport layer and a charge blocking layer. An example of the material of the charge transport layer is a material having a high hole mobility or electron mobility. As the material of a hole blocking layer of the charge blocking layer, it is possible to use a material having a deep HOMO (Highest Occupied Molecular Orbital) (energetically far from the vacuum level). On the other hand, as the material of an electron blocking layer of the charge blocking layer, it is possible to use a material having a shallow LUMO (Lowest Unoccupied Molecular Orbital) (close to the vacuum level). The HOMO and the LUMO can also be expressed as high and low based on the magnitude of an absolute value. More specifically, "the HOMO is deep" may also be expressed as "the HOMO is high". This similarly applies to the LUMO.

A charge injection layer can be formed on the interface between the lower electrodes 210 and the additional function layer, or on the interface between the upper electrode 212 and the additional function layer. As an electron injection layer of the charge injection layer, it is possible to use a thin film (for example, 0.5 to 1 nm) of an alkaline (earth) metal or an alkaline (earth) metal compound. Examples of the electron injection layer are lithium fluoride (LiF), potassium fluoride (KF), and magnesium oxide (MgO).

As the electron injection layer of the charge injection layer, it is also possible to use a layer obtained by mixing a metal or metal compound that functions as a donor (electron-donating) dopant in an organic compound. To improve the electron injection efficiency, a metal having a low work function or a compound of the metal can be used as a dopant. As the metal having a low work function, it is possible to use an alkaline metal, an alkaline earth metal, or a rare-earth metal. An alkaline earth compound that can be handled relatively easily in the atmosphere may also be used as the electron injection layer. For example, the alkaline metal compound can be a cesium compound, and cesium carbonate is stable in the atmosphere and easy to handle. The organic compound of the electron injection layer can also be an electron transporting material, and it is possible to use a well-known material, for example, an aluminum quinolinol complex or a phenanthroline compound. Since the alkaline metal easily reacts with water, it is necessary to suppress permeation of water in the same manner as in the organic function layer 211.

An example of the organic device 100 of this embodiment will be described below. In this example, the organic function layer 211 contains an organic light emitting material. Accordingly, the organic device 100 functions as a light emitting device.

First, a silicon substrate was prepared as a substrate 201. After electronic circuits (not shown) and pad electrodes 30 were formed on the substrate 201, an insulating layer 202 was formed on the upper surface of the substrate 201 on which the electronic circuits (not shown) and the pad electrodes 30 using an aluminum alloy were formed. In this example, a 1-µm thick silicon oxide layer was formed as the insulating layer 202. Then, a mask pattern having openings above the pad electrodes 30 was used to etch the insulating layer 202 below the openings of the mask pattern, thereby performing an etching step of exposing the pad electrodes 30. First, a mask pattern having desired openings was formed by resist coating, exposure, and development, and the insulating layer 202 was etched by plasma etching using a reactive gas in a dry etching apparatus. After the insulating layer 202 was etched, the mask pattern was removed by a stripping solution.

Then, in a pixel region 10, a pixel formation step of forming a plurality of pixels on the insulating layer 202 was performed. First, lower electrodes 210 were formed by sequentially stacking an aluminum alloy and indium tin oxide on the insulating layer 202 from the upper surface side of the substrate 201. As described above, the lower electrodes 210 were connected to the electronic circuits formed on that side of the insulating layer 202, which faced the substrate 201, by plug electrodes formed in the insulating layer 202.

After the lower electrodes 210 were formed, an organic function layer 211 containing an organic light emitting material was formed on the lower electrodes 210 in the pixel region 10. As a method of forming the organic function layer 211, vacuum vapor deposition using a vapor deposition mask having a desired opening pattern can be used.

After the pixel formation step of forming a plurality of pixels on the insulating layer 202, a sealing layer 300 and a resin layer 400 were stacked in this order. First, the sealing layer 300 was so formed as to cover the whole substrate 201. A 1,500-nm thick silicon nitride layer was formed as a water preventing layer 301 on the entire surface of the substrate 201 by using the CVD method. Then, a 100-nm thick aluminum oxide layer was formed as a defect preventing layer 302 on the entire surface of the substrate 201 by using the ALD method, so as to cover the water preventing layer 301. In addition, a 500-nm thick silicon nitride layer was formed as a water preventing layer 303 on the entire surface of the substrate 201 by using the CVD method, so as to cover the defect preventing layer 302. Then, the entire surface of the substrate 201 was coated with a 400-nm thick resin layer as the resin layer 400 by using the spin coating method, so as to cover the water preventing layer 303, and the resin layer 400 was calcined at a high temperature. As described earlier, the resin layer 400 also functions as a planarizing layer below the color filter 500.

Subsequently, a color filter 500 was formed in the pixel region 10. A red transmission filter 501, a green transmission filter 502, and a blue transmission filter 503 were formed by repeating material coating, exposure, and development for the color filter of each color.

After the color filter 500 was formed, the resin layer 400 and the sealing layer 300 on the pad electrodes 30 were etched. First, a mask pattern having an opening to the outside of the outer edge of the pad electrode 30 in orthogonal projection to a main surface 205 of the substrate 201 was formed by using resist coating, exposure, and development. Then, the water preventing layer 303 was etched by plasma etching using a reactive gas in a dry etching apparatus. After the water preventing layer 303 was etched, the mask pattern was removed by a stripping solution. Next, a mask pattern having an opening inside the outer edge of the pad electrode 30 in orthogonal projection to a main surface 205 of the substrate 201 was formed by using resist coating, exposure, and development. The defect preventing layer 302 and the water preventing layer 301 were etched using the mask pattern to expose the pad electrodes 30. After the defect preventing layer 302 and the water preventing layer 301 were etched, the mask pattern was removed by a stripping solution.

After the pad electrodes 30 were exposed, conductive particles 600 for electrical connection to an electrode arranged outside the organic device 100 were arranged on the pad electrodes 30. More specifically, an anisotropic conductive film (ACF) containing the conductive particles 600 was compression-bonded. At this time, it was confirmed that occurrence of a bonding failure was suppressed, when compared to a case in which the overall openings formed in the sealing layer 300 and the resin layer 400 were arranged inside the outer edge of the pad electrode 30.

Application examples in which the organic device 100 of this embodiment is applied to an image forming device, a display device, a photoelectric conversion device, an electronic apparatus, an illumination device, a moving body, and a wearable device will be explained below with reference to FIGS. 4 to 12B. After describing details and modifications of the above-described organic device 100, the application examples will be explained. A light emitting element that uses an organic light emitting material for the organic function layer 211 will be exemplified as the organic device 100.

The organic light emitting element is formed by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

Quartz, glass, a silicon wafer, a resin, a metal, or the like may be used as a substrate. Furthermore, a switching element such as a transistor and a wiring may be provided on the substrate, and an insulating layer may be provided thereon. The insulating layer can be made of any material as long as a contact hole can be formed so that the wiring can be formed between the insulating layer and the first electrode and insulation from the unconnected wiring can be ensured. For example, a resin such as polyimide, silicon oxide, silicon nitride, or the like can be used.

A pair of electrodes can be used as the electrodes. The pair of electrodes can be an anode and a cathode. When an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a work function as large as possible can be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. When the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function can be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used.

For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multilayer structure. For example, silver may be used. To suppress aggregation of silver, a silver alloy may be used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is used to provide the good film coverage and easily lower the resistance.

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by the CVD method. The protection layer may be provided using an atomic deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

The organic light emitting device can include an optical member such as a microlens on the light emission side. The microlens can be made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircular of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

A counter substrate can be provided on the planarizing layer. The counter substrate is called a counter substrate because it is provided at a position corresponding to the above-described substrate. The constituent material of the counter substrate can be the same as that of the above-described substrate. When the above-described substrate is the first substrate, the counter substrate can be the second substrate.

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

The organic light emitting device includes a plurality of pixels. Each pixel includes sub-pixels that emit light components of different colors. The sub-pixels include, for example, R, G, and B emission colors, respectively.

In each pixel, a region also called a pixel opening emits light. This region is the same as the first region. The pixel opening can have a size of 5 $\mu$m (inclusive) to 15 $\mu$m (inclusive). More specifically, the pixel opening can have a size of 11 $\mu$m, 9.5 $\mu$m, 7.4 $\mu$m, 6.4 $\mu$m, or the like.

A distance between the sub-pixels can be 10 $\mu$m or less, and can be, more specifically, 8 $\mu$m, 7.4 $\mu$m, or 6.4 $\mu$m.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle. The shape of the sub-pixel and the pixel arrangement can be used in combination.

The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

The display device according to the embodiment will be described next with reference to the accompanying drawings.

Figures 4A, 4B:
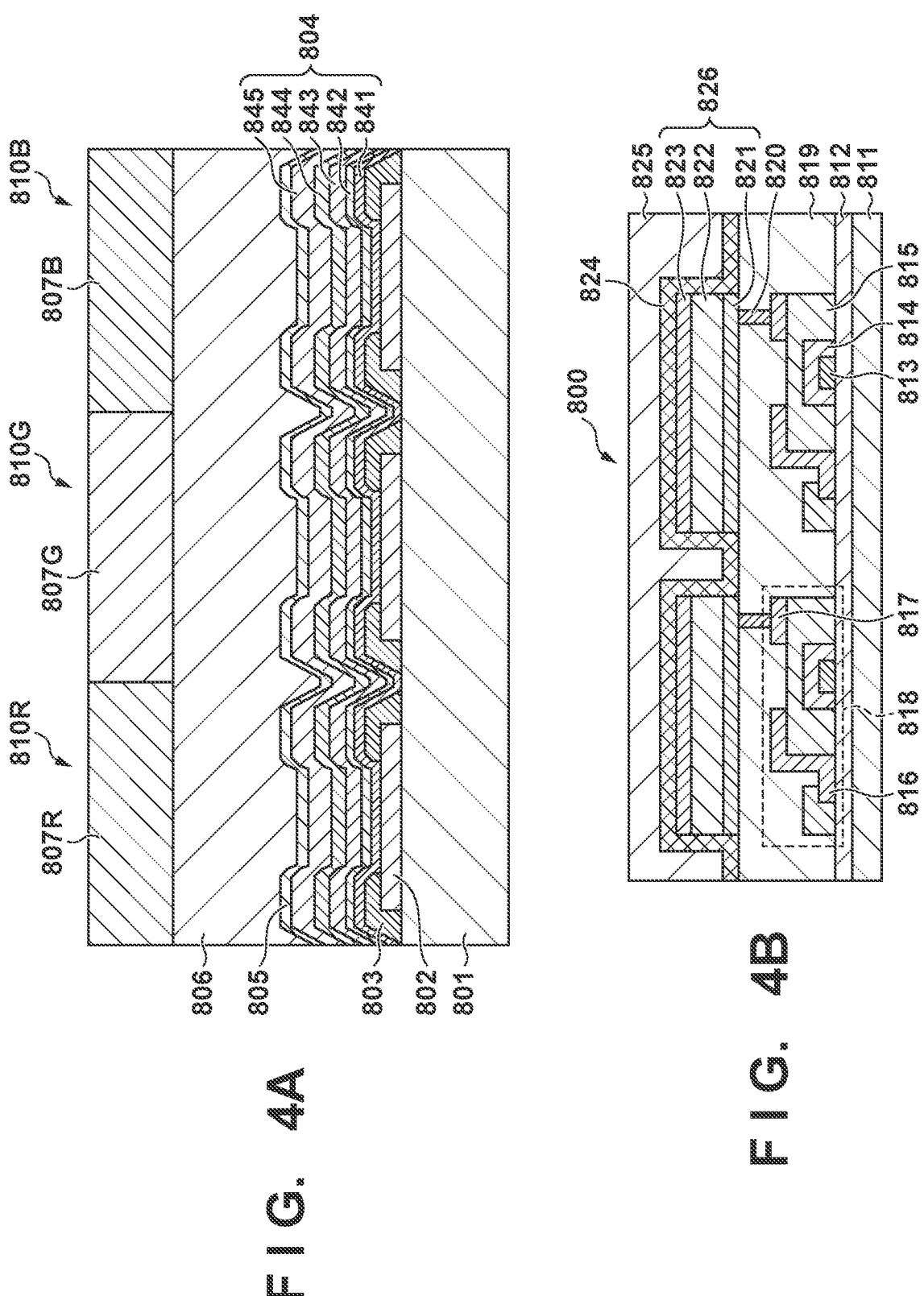
FIGS. 4A and 4B are sectional views of the organic device shown in FIG. 1.

FIGS. 4A and 4B are schematic sectional views showing an example of the display device including the organic light emitting element and the transistor connected to it. The transistor is an example of an active element. The transistor may be a thin-film transistor (TFT).

FIG. 4A shows an example of a pixel as a constituent element of the display device according to this embodiment. The pixel includes sub-pixels 810. The sub-pixels are divided into sub-pixels 810R, 810G, and 810B by emitted light components. The light emission colors may be discriminated by wavelengths of light components emitted from the light emitting layers, or light emitted from each sub-pixel may be selectively transmitted or undergo color conversion by a color filter or the like. Each sub-pixel includes a reflective electrode 802 as the first electrode on an interlayer insulating layer 801, an insulating layer 803 covering the end of the reflective electrode 802, an organic compound layer 804 covering the first electrode and the insulating layer, a transparent electrode 805 as the second electrode, a protection layer 806, and a color filter 807.

The interlayer insulating layer 801 can include a transistor and a capacitive element arranged in the interlayer insulating layer 801 or a layer below it. The transistor and the first electrode can electrically be connected via a contact hole (not shown) or the like.

The insulating layer 803 is also called a bank or a pixel separation film. The insulating layer 803 covers the end of the first electrode, and is arranged to surround the first electrode. A portion where no insulating layer is arranged contacts the organic compound layer 804 to form a light emission region.

The organic compound layer 804 includes a hole injection layer 841, a hole transport layer 842, a first light emitting layer 843, a second light emitting layer 844, and an electron transport layer 845.

The second electrode may be a transparent electrode, a reflective electrode, or a translucent electrode.

The protection layer 806 suppresses permeation of water into the organic compound layer. The protection layer is shown as a single layer but may include a plurality of layers. Each layer can be an inorganic compound layer or an organic compound layer.

The color filter 807 is divided into color filters 807R, 807G, and 807B by colors. The color filters can be formed on the planarizing layer (not shown). A resin protection layer (not shown) can be provided on the color filters. The color filters can be formed on the protection layer 806. Alternatively, the color filters can be provided on the counter substrate such as a glass substrate, and then the substrate may be bonded.

A display device 800 shown in FIG. 4B is provided with an organic light emitting element 826 and a TFT 818 as an example of a transistor. A substrate 811 of glass, silicon, or the like is provided and an insulating layer 812 is provided on the substrate 811. The active element such as the TFT 818 is arranged on the insulating layer, and a gate electrode 813, a gate insulating film 814, and a semiconductor layer 815 of the active element are arranged. The TFT 818 further includes the semiconductor layer 815, a drain electrode 816, and a source electrode 817. An insulating film 819 is provided on the TFT 818. The source electrode 817 and an anode 821 forming the organic light emitting element 826 are connected via a contact hole 820 formed in the insulating film.

Note that a method of electrically connecting the electrodes (anode and cathode) included in the organic light emitting element 826 and the electrodes (source electrode and drain electrode) included in the TFT is not limited to that shown in FIG. 4B. That is, one of the anode and cathode and one of the source electrode and drain electrode of the TFT are electrically connected. The TFT indicates a thin-film transistor.

In the display device 800 shown in FIG. 4B, an organic compound layer is illustrated as one layer. However, an organic compound layer 822 may include a plurality of layers. A first protection layer 824 and a second protection layer 825 are provided on a cathode 823 to suppress degradation of the organic light emitting element.

A transistor is used as a switching element in the display device 800 shown in FIG. 4B but may be used as another switching element.

The transistor used in the display device 800 shown in FIG. 4B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that a thin-film transistor is also called a TFT element.

The transistor included in the display device 800 shown in FIG. 4B may be formed in the substrate such as an Si substrate. Forming the transistor in the substrate means forming the transistor by processing the substrate such as an Si substrate. That is, when the transistor is included in the substrate, it can be considered that the substrate and the transistor are formed integrally.

The light emission luminance of the organic light emitting element according to this embodiment can be controlled by the TFT which is an example of a switching element, and the plurality of organic light emitting elements can be provided in planes to display an image with the light emission luminances of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light emitting element can be provided on the Si substrate.

Figure 5A:
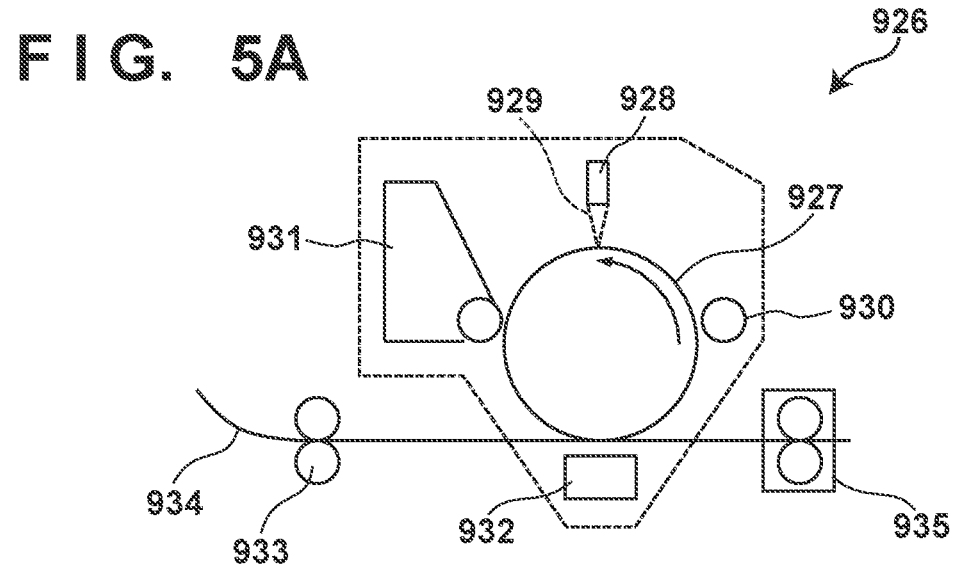
FIGS. 5A to 5C are views showing an example of an image forming device using the organic device of the embodiment.
Figure 5B:
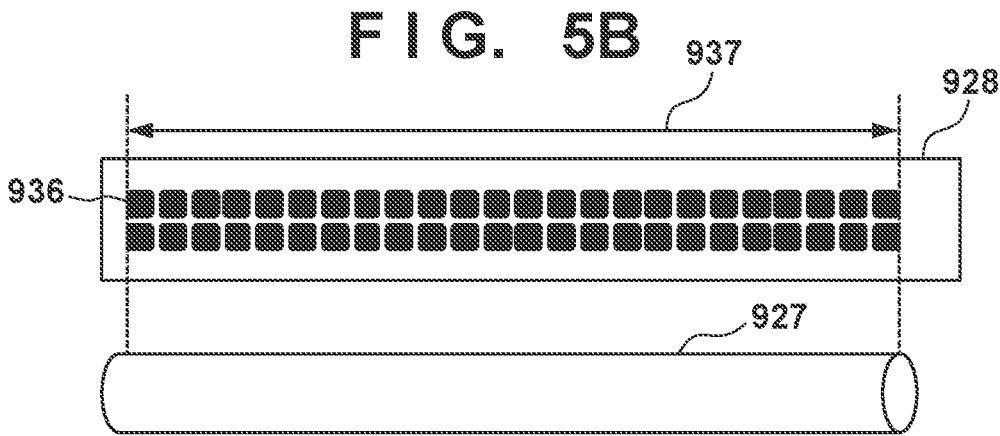
Figure 5C:
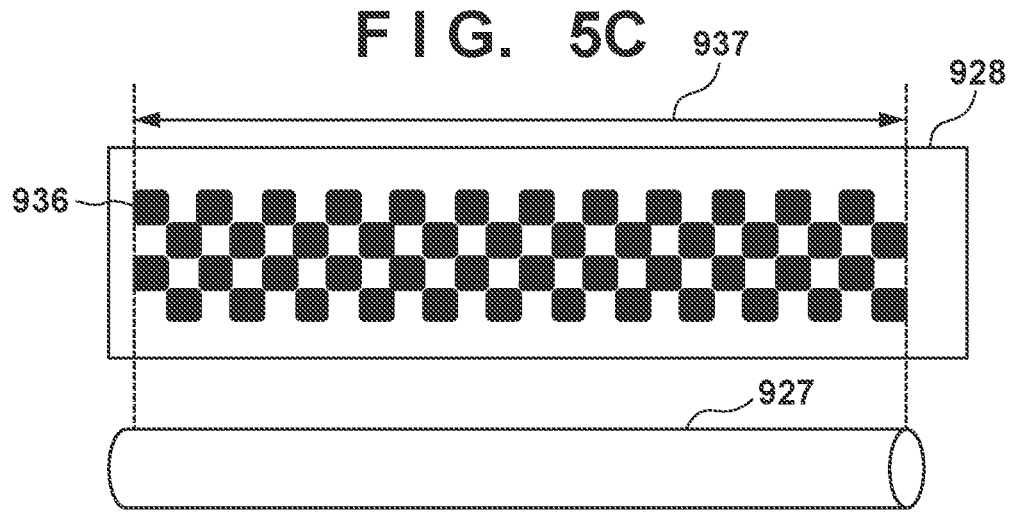

FIGS. 5A to 5C are schematic views showing an example of an image forming device using the organic device 100 of this embodiment. An image forming device 926 shown in FIG. 5A includes a photosensitive member 927, an exposure light source 928, a developing unit 931, a charging unit 930, a transfer device 932, a conveyance unit 933 (a conveyance roller in the arrangement shown in FIG. 5A), and a fixing device 935.

Light 929 is emitted from the exposure light source 928, and an electrostatic latent image is formed on the surface of the photosensitive member 927. The organic device 100 containing the organic light emitting material in the organic function layer 211 can be applied to the exposure light source 928. The developing unit 931 can function as a developing device that includes a toner or the like as a developing agent and applies the developing agent to the exposed photosensitive member 927. The charging unit 930 charges the photosensitive member 927. The transfer device 932 transfers the developed image to a print medium 934. The conveyance unit 933 conveys the print medium 934. The print medium 934 can be, for example, paper or a film.

The fixing device 935 fixes the image formed on the print medium.

Each of FIGS. 5B and 5C is a schematic view showing a plurality of light emitting units 936 arranged in the exposure light source 928 along the longitudinal direction of a long substrate. The organic device 100 containing the organic light emitting material in the organic function layer 211 can be applied to each of the light emitting units 936. That is, the plurality of pixels arranged in the pixel region 10 are arranged along the longitudinal direction of the substrate. A direction 937 is a direction parallel to the axis of the photosensitive member 927. This column direction matches the direction of the axis upon rotating the photosensitive member 927. This direction 937 can also be referred to as the long-axis direction of the photosensitive member 927.

FIG. 5B shows a form in which the light emitting units 936 are arranged along the long-axis direction of the photosensitive member 927. FIG. 5C shows a form, which is a modification of the arrangement of the light emitting units 936 shown in FIG. 5B, in which the light emitting units 936 are arranged in the column direction alternately between the first column and the second column. The light emitting units 936 are arranged at different positions in the row direction between the first column and the second column. In the first column, the plurality of light emitting units 936 are arranged spaced apart from each other. In the second column, the light emitting unit 936 is arranged at the position corresponding to the space between the light emitting units 936 in the first column. Furthermore, in the row direction, the plurality of light emitting units 936 are arranged spaced apart from each other. The arrangement of the light emitting units 936 shown in FIG. 5C can be referred to as, for example, an arrangement in a grid pattern, an arrangement in a staggered pattern, or an arrangement in a checkered pattern.

FIG. 6 is a schematic view showing an example of the display device using the organic device 100 of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The organic device 100 containing the organic light emitting material in the organic function layer 211 can be applied to the display panel 1005. The organic device 100 functioning as the display panel 1005 is connected to the active elements such as transistors arranged on the circuit board 1007 and operates.

The display device 1000 shown in FIG. 6 can be used for a display unit of a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

FIG. 7 is a schematic view showing an example of the photoelectric conversion device using the organic device 100 of this embodiment. A photoelectric conversion device 1100 can include a viewfinder 1101, a rear display 1102, an operation unit 1103, and a housing 1104. The photoelectric conversion device 1100 can also be called an image capturing device. The organic device 100 containing the organic light emitting material in the organic function layer 211 can be applied to the viewfinder 1101 as a display unit. In this case, the organic device 100 can display not only an image to be captured but also environment information, image capturing instructions, and the like. Examples of the environment information are the intensity and direction of external light, the moving velocity of an object, and the possibility that an object is covered with an obstacle.

Since the timing suitable for image capturing is a very short time, it is better to display the information as soon as possible. Therefore, the organic device 100 containing the organic light emitting material such as an organic EL element can be used for the viewfinder 1101. This is so because the organic light emitting material has a high response speed. The organic device 100 using the organic light emitting material can be used for the apparatuses that require a high display speed more suitably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The organic device 100 may be applied to a display unit of an electronic apparatus. At this time, the display unit can have both a display function and an operation function. Examples of the portable terminal are a portable phone such as a smartphone, a tablet, and a head mounted display.

FIG. 8 is a schematic view showing an example of an electronic apparatus using the organic device 100 of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The organic device 100 containing the organic light emitting material in the organic function layer 211 can be applied to the display unit 1201.

Figure 9A:
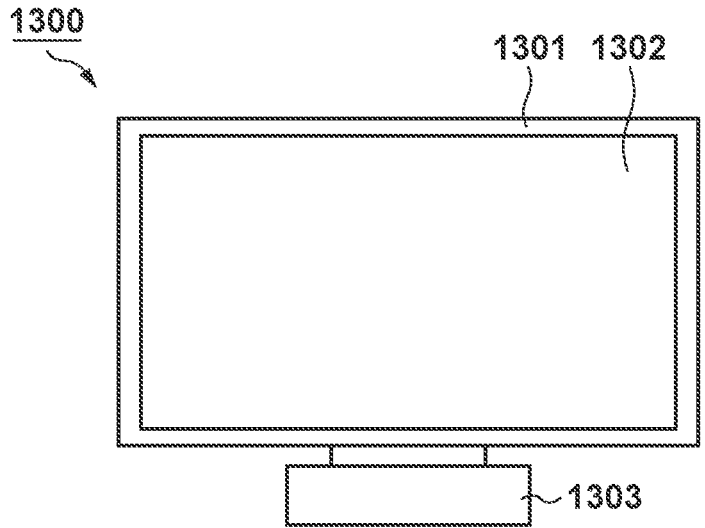
FIGS. 9A and 9B are views each showing an example of a display device using the organic device of the embodiment.
Figure 9B:
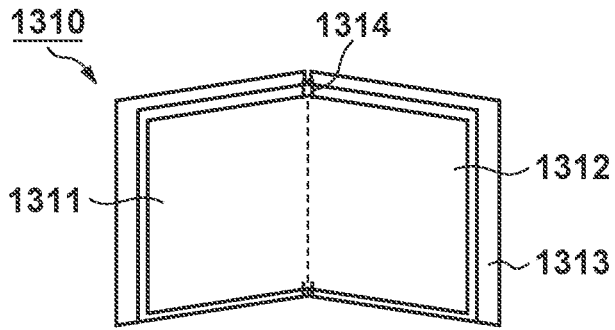

FIGS. 9A and 9B are schematic views showing examples of the display device using the organic device 100 of this embodiment. FIG. 9A shows a display device such as a television monitor or a PC monitor. A display device 1300 includes a frame 1301 and a display unit 1302. The organic device 100 containing the organic light emitting material in the organic function layer 211 can be applied to the display unit 1302. The display device 1300 can include a base 1303 that supports the frame 1301 and the display unit 1302. The base 1303 is not limited to the form shown in FIG. 9A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 9B is a schematic view showing another example of the display device using the organic device 100 of this embodiment. A display device 1310 shown in FIG. 9B can be folded, and is a so-called foldable display device. The display device 1310 includes a first display unit 1311, a second display unit 1312, a housing 1313, and a bending point 1314. The organic device 100 containing the organic light emitting material in the organic function layer 211 can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 10:
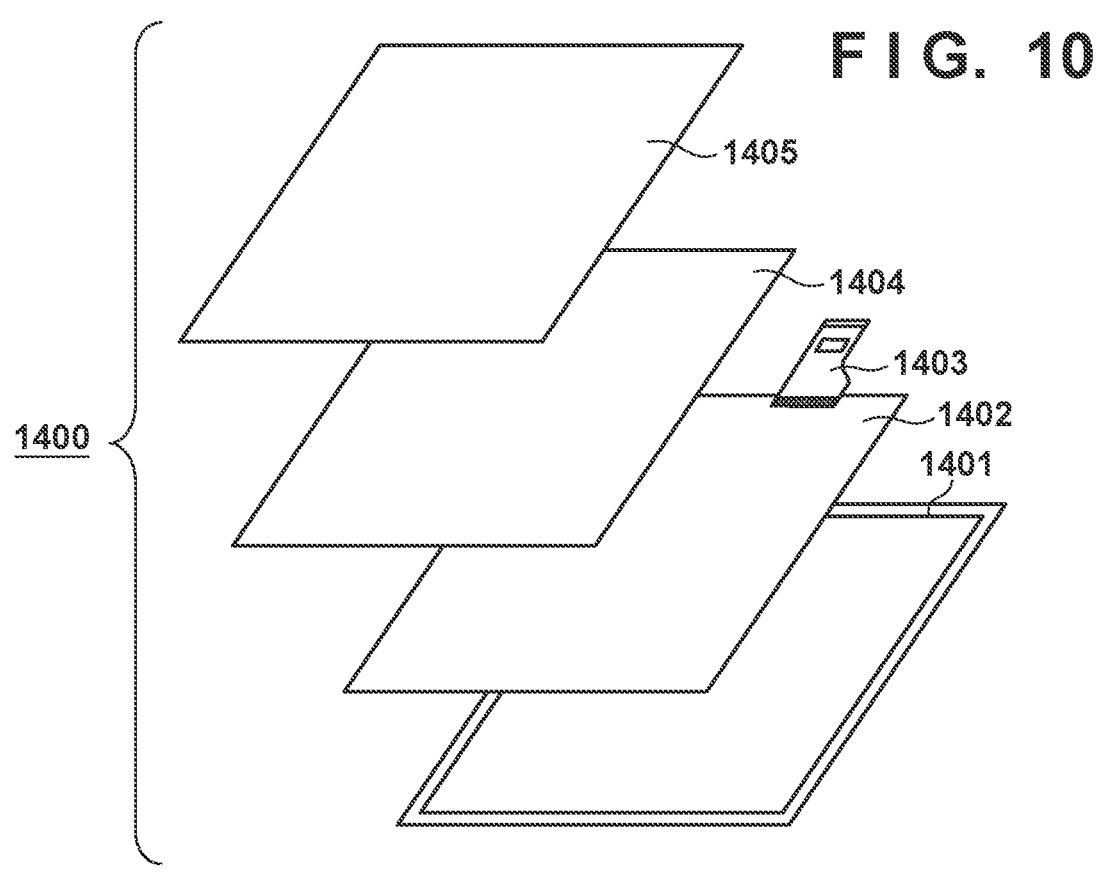
FIG. 10 is a view showing an example of an illumination device using the organic device of the embodiment.

FIG. 10 is a schematic view showing an example of the illumination device using the organic device 100 of this embodiment. An illumination device 1400 can include a housing 1401, a light source 1402, a circuit board 1403, an optical film 1404, and a light diffusing unit 1405. The organic device 100 containing the organic light emitting material in the organic function layer 211 can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the organic device 100 functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 11:
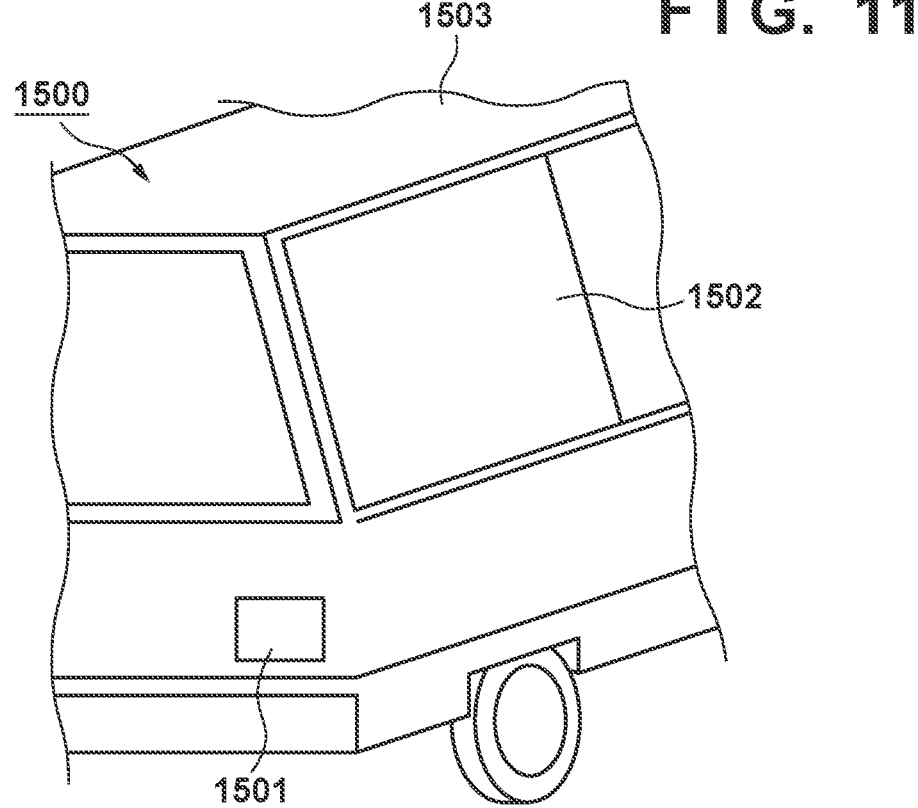
FIG. 11 is a view showing an example of a moving body using the organic device of the embodiment.

FIG. 11 is a schematic view of an automobile having a taillight as an example of a vehicle lighting appliance using the organic device 100 of this embodiment. An automobile 1500 has a taillight 1501, and can have a form in which the taillight 1501 is turned on when performing a braking operation or the like. The organic device 100 of this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The organic device 100 containing the organic light emitting material in the organic function layer 211 can be applied to the taillight 1501. The taillight 1501 can include a protection member for protecting the organic device 100 functioning as the taillight 1501. The material of the protection member is not limited as long as the material is a transparent material with a strength that is high to some extent, and an example is polycarbonate. A furandicarboxylic acid derivative, an acrylonitrile derivative, or the like may be mixed in polycarbonate.

The automobile 1500 can include a vehicle body 1503, and a window 1502 attached to the vehicle body 1503. This window can be a window for checking the front and back of the automobile, and can also be a transparent display. For this transparent display, the organic device 100 containing the organic light emitting material in the organic function layer 211 may be used. In this case, the constituent materials of the electrodes and the like of the organic device 100 are formed by transparent members.

Further application examples of the above-described organic device 100 will be described with reference to FIGS. 12A and 12B. The organic device 100 can be applied to a system that can be worn as a wearable device such as smartglasses, an HMD (Head Mounted Display), or a smart contact lens. An image capturing display device used for such application examples can include an image capturing device capable of photoelectrically converting visible light and a light emitting device capable of emitting visible light.

Glasses 1600 (smartglasses) according to one application example will be described with reference to FIG. 12A. An image capturing device 1602 such as a CMOS sensor or an SPAD is provided on the surface side of a lens 1601 of the glasses 1600. In addition, the above-described organic device 100 is provided on the back surface side of the lens 1601.

The glasses 1600 further includes a control device 1603. The control device 1603 functions as a power supply that supplies electric power to the image capturing device 1602 and the organic device 100 according to each embodiment. In addition, the control device 1603 controls the operations of the image capturing device 1602 and the organic device 100. An optical system configured to condense light to the image capturing device 1602 is formed on the lens 1601.

Glasses 1610 (smartglasses) according to one application example will be described with reference to FIG. 12B. The glasses 1610 includes a control device 1612, and an image capturing device corresponding to the image capturing device 1602 and the organic device 100 are mounted on the control device 1612. The image capturing device in the control device 1612 and an optical system configured to project light emitted from the organic device 100 are formed in a lens 1611, and an image is projected to the lens 1611. The control device 1612 functions as a power supply that supplies electric power to the image capturing device and the organic device 100, and controls the operations of the image capturing device and the organic device 100. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The organic device 100 according to the embodiment of the present invention can include an image capturing device including a light receiving element, and control a displayed image based on the line-of-sight information of the user from the image capturing device.

More specifically, the organic device 100 decides a first visual field region at which the user is gazing and a second visual field region other than the first visual field region based on the line-of-sight information. The first visual field region and the second visual field region may be decided by the control device of the organic device 100, or those decided by an external control device may be received. In the display region of the organic device 100, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the organic device 100, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the organic device 100, the image capturing device, or an external device. If the external device holds the AI program, it is transmitted to the organic device 100 via communication.

When performing display control based on line-of-sight detection, smartglasses further including an image capturing device configured to capture the outside can be applied. The smartglasses can display captured outside information in real time.

According to the present invention, it is possible to provide a technique advantageous in improving the reliability of an organic device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-123564, filed Jul. 28, 2021, which is hereby incorporated by reference herein in its entirety.

What is claimed is:

1. An organic device, comprising:
a substrate having a main surface comprising a pixel region and a peripheral region;
and a sealing layer arranged to cover the pixel region and the peripheral region, the sealing layer comprising a first layer and a second layer arranged between the first layer and the main surface;
the pixel region comprising a plurality of pixels including an organic function layer arranged therein;
the peripheral region including a pad electrode;
the sealing layer having a stepped opening in the peripheral region which exposes the pad electrode, the stepped opening comprising a first portion extending from a plane defined by an upper surface of the sealing layer towards the pad electrode, and a second portion which has an outer edge inside an outer edge of the first portion and an outer edge of the pad electrode in an orthogonal projection to the main surface, and which opens from a lower end of the first portion to the pad electrode; and
a conductive particle configured to electrically connect to an electrode arranged outside the organic device being arranged on the pad electrode, wherein
a diameter of the conductive particle is larger than a height of the second portion,
the outer edge of the first portion is defined by an inner edge of an opening formed in the first layer, and
the outer edge of the first portion is arranged outside the outer edge of the pad electrode in an orthogonal projection to the main surface.

2. The organic device according to claim 1, wherein the conductive particle is contained in an anisotropic conductive film.

3. The organic device according to claim 1, wherein the first portion opens in the first layer and the second portion opens in the second layer.

4. The organic device according to claim 3, wherein the sealing layer further comprises a third layer arranged between the second layer and the main surface and formed using a material different from the second layer, and the second portion opens in the second layer and the third layer.

5. The organic device according to claim 4, wherein the second layer has a lower defect density than each of the first layer and the third layer.

6. The organic device according to claim 4, wherein the first layer and the third layer use the same material.

7. The organic device according to claim 1, comprising an insulating layer that covers the pixel region and the peripheral region;
the insulating layer being arranged between the organic function layer and the main surface in the pixel region; and
the insulating layer being arranged between the sealing layer and the main surface in the peripheral region, wherein
an opening is formed in the insulating layer, and
an outer edge of the opening of the insulating layer is arranged outside the outer edge of the second portion in an orthogonal projection to the main surface.

8. The organic device according to claim 4, comprising an insulating layer that covers the pixel region and the peripheral region;

the insulating layer being arranged between the organic function layer and the main surface in the pixel region, the insulating layer being arranged between the sealing layer and the main surface in the peripheral region, wherein an opening is formed in the insulating layer, an outer edge of the opening of the insulating layer is arranged outside the outer edge of the second portion in an orthogonal projection to the main surface, and water permeability of the third layer is lower than water permeability of the insulating layer.

9. The organic device according to claim 1, wherein the pad electrode includes a first pad electrode and a second pad electrode that are adjacent to each other, and the first portion formed in correspondence with the first pad electrode and the first portion formed in correspondence with the second pad electrode are formed continuously.

10. The organic device according to claim 1, wherein a resin layer is further arranged on the sealing layer, an opening for exposing the pad electrode is formed in the resin layer in the peripheral region, and an outer edge of the opening of the resin layer is arranged outside the outer edge of the second portion in an orthogonal projection to the main surface.

11. The organic device according to claim 10, wherein the outer edge of the opening of the resin layer is arranged to overlap the outer edge of the first portion in an orthogonal projection to the main surface.

12. The organic device according to claim 1, comprising a color filter arranged above the resin layer in the pixel region.

13. The organic device according to claim 1, wherein the organic function layer contains an organic light emitting material.

14. The organic device according to claim 1, wherein the organic function layer contains an organic photoelectric conversion material.

15. The organic device according to claim 1, wherein the plurality of pixels are arranged along a longitudinal direction of the substrate.

16. An image forming device comprising a photosensitive member, an exposure light source configured to expose the photosensitive member, a developing device configured to apply a developing agent to the exposed photosensitive member, and a transfer device configured to transfer an image developed by the developing device to a print medium, wherein the exposure light source comprises the organic device according to claim 1.

17. A display device comprising the organic device according to claim 1, and an active element connected to the organic device.

18. A photoelectric conversion device comprising an optical unit including a plurality of lenses, an image sensor configured to receive light having passed through the optical unit, and a display unit configured to display an image, wherein the display unit is configured to display an image captured by the image sensor, and comprises the organic device according to claim 1.

19. An electronic apparatus comprising a housing provided with a display unit, and a communication unit provided in the housing and configured to perform external communication, wherein the display unit comprises the organic device according to claim 1.

20. An illumination device comprising a light source, and at least one of a light diffusing unit and an optical film, wherein the light source comprises the organic device according to claim 1.

21. A moving body comprising a main body, and a lighting appliance provided in the main body, wherein the lighting appliance comprises the organic device according to claim 1.

22. A wearable device comprising a display device configured to display an image, wherein the display device comprises the organic device according to claim 1.

23. The organic device according to claim 1, wherein the second layer is formed using a material different from the first layer.

24. The organic device according to claim 1, wherein the substrate is a glass or semiconductor substrate.

* * * * *